United States Patent [19]

Putt et al.

[11] 4,447,471

[45] May 8, 1984

[54] METHOD OF TREATING THERMOPLASTIC SURFACES

[75] Inventors: Ronald A. Putt, Palatine; Alan I. Attia, Arlington Heights, both of Ill.

[73] Assignee: Gould Inc., Rolling Meadows, Ill.

[21] Appl. No.: 454,786

[22] Filed: Dec. 30, 1982

[51] Int. Cl.$^3$ .......................... C23C 3/02; H05K 3/18
[52] U.S. Cl. ....................................... 427/98; 156/668; 156/902; 427/306; 427/307
[58] Field of Search ................ 156/668, 902; 427/307, 427/306, 98

[56] References Cited

U.S. PATENT DOCUMENTS

| | | | |
|---|---|---|---|
| 3,489,590 | 1/1970 | Herwig | 427/307 |
| 3,560,241 | 2/1971 | Davis | 427/307 |
| 3,869,303 | 3/1975 | Orlov | 427/307 |
| 4,125,649 | 11/1978 | Donovan | 427/307 |
| 4,339,303 | 7/1982 | Frisch | 427/307 |

FOREIGN PATENT DOCUMENTS 755887  8/1980  U.S.S.R. .............................. 427/307

OTHER PUBLICATIONS

"Thermoplastics Take to the Boards"–Jerry Lyman–pp. 105, 106 of Electronics Magazine of Mar. 10, 1982.

*Primary Examiner*—John D. Smith
*Attorney, Agent, or Firm*—Edward E. Sachs; John C. Tiernan

[57] ABSTRACT

Activation of thermoplastics, such as polyphenylene sulfide, polysulfone, and polyether sulfone thermoplastics by subjection thereof to bromine is disclosed. The activation process is carried out at relatively low temperatures, such as below 200° F. and illustratively, may be carried out at room temperatures. The bromine, in the illustrated embodiment, is provided in an aqueous solution with or without acids or halide salts. The halide salts, when utilized, provide control of the activity of the bromine. The process advantageously adapted for activating the thermoplastic material where it is intended that it serve as a substrate for use in accepting copper plating, as in printed circuit board manufacture.

19 Claims, No Drawings

METHOD OF TREATING THERMOPLASTIC SURFACES

DESCRIPTION

1. Technical Field

This invention relates to the treatment of thermoplastic surfaces, such as for preparing the surfaces for subsequent metal layer deposition thereon.

2. Background Art

In the manufacture of printed circuit boards, a thin layer of electroless copper is deposited on a substrate followed by the deposition of a thicker layer of electrodeposited copper thereon. In order to provide a proper and good bond between the substrate, which conventionally is formed of nonconductive material, such as thermoplastic synthetic resin material, and the conductive copper layer, it is important to provide a surface on the substrate which is suitably reactive to nucleate with the electroless layer. Conventionally, the electroless layer includes palladium and it is desirable to activate the substrate surface so as to nucleate the palladium.

It has been conventional to effect such treatment of the surface by etching or abrading the surface. The known methods of treating the substrate surface have not proven completely satisfactory in that they have tended to damage the substrate surface portion impairing the dimensional stability of the substrate.

A number of thermoplastic synthetic resins have been found to be advantageously adapted for use as substrates in printed circuit boards. An excellent example of such a material is a polyphenylene sulfide sold under the trademark Ryton, polysulfone sold under the trademark Udel by Union Carbide, and polyether sulfone sold under the trade name Victrex by Imperial Chemical Industries Ltd.

While polyphenylene sulfide is a particularly advantageous material for such printed circuit board use, it has been particularly difficult to provide thereon the desirable activated surface.

DISCLOSURE OF INVENTION

The present invention comprehends an improved manufacture wherein a thermoplastic synthetic resin suitable for use as a substrate in a printed circuit board structure is activated by subjection to bromine in a controlled environment.

More specifically, the invention comprehends that the substrate comprise a thermoplastic synthetic resin, such as polyphenylene sulfide, polysulfone, polyether sulfone, and the like, and that the surface be treated by subjection thereof to bromine in an aqueous solution providing controlled reaction of the bromine with the synthetic resin material.

More specifically, the invention comprehends providing the bromine in an aqueous solution selected from the group consisting of an aqueous chloride solution and an aqueous bromide solution.

Further more specifically, the treating composition may comprise a solution of bromine in an aqueous solution selected from the group consisting of quaternary ammonium chloride, quaternary ammonium bromide, Group I chloride, Group II chloride, Group III chloride, Group I bromide, Group II bromide, and Group III bromide salt solutions.

The invention comprehends the use of bromine as a surface treating agent at relatively low temperature, such as less than approximately 200° F., for facilitated manufacture.

The surface is properly degreased prior to the step of subjecting the surface to the aqueous solution of bromine.

The invention comprehends the provision of the further step of depositing a layer of electroless copper on the synthetic resin surface following the subjection thereof to the bromine. The electroless copper layer provides desirable adhesion for a subsequent plating of an electrolytic copper, such as in the forming of printed circuit boards and the like.

Thus, the invention comprehends the controlled use of bromine for activating a surface portion of certain thermoplastics, such as for subsequent electroless copper or nickel plating by conventional commercial processes. The invention is extremely simple and economical while yet providing the highly improved results discussed above and herefollowing.

BEST MODE FOR CARRYING OUT THE INVENTION

The present invention is concerned with the activation of the surface of a thermoplastic body by controlled application of bromine thereto.

More specifically, the invention is concerned with the activation of a surface portion of a thermoplastic body formed of a material, such as polyphenylene sulfide, polysulfone, and polyether sulfone. One example of such a polyphenylene sulfide thermoplastic is Ryton, a product of Phillips Petroleum Co. One example of such a polysulfone thermoplastic is Udel, manufactured by Union Carbide Corp., of Danbury, Conn. One such polyether sulfone thermoplastic is Victrex, manufactured by Imperial Chemical Industires Ltd., Wilmington, Del.

Such thermoplastics have been found to be advantageously useful as substrates in printed circuit boards. However, to provide a proper adhesion of the electrodeposited copper in the manufacture of the printed circuit board, it has been found desirable to either etch chemically, abrade, or somehow activate the surface portion of the substrate member on which the copper is to be electrodeposited. Conventionally, a thin layer of electroless copper or nickel is deposited on the treated surface of the thermoplastic substrate prior to the electrodeposition of the thicker copper layer. The treatment of the substrate surface portion is critical for developing a good bond between the nonconductive thermoplastic substrate and the conductive copper or nickel layer.

It has been conventional to abrade the surface of the substrate as by sandblasting before carrying out the electroless plating step. This treatment, however, has been found to cause damage to the surface finish of the substrate member, thereby impairing the dimensional stability thereof.

It has been conventional heretofore, in the treatment of a polysulfone substrate member, to attack the surface portion with a pre-etch solvent before final chemical etching and electroless plating. Such solvent treatment of the polysulfone substrate may damage the surface portion.

The present invention comprehends the improved treatment of a surface portion of such substrate thermoplastic materials so as to activate the surface portion, such as for use in applying an electroless copper or nickel plating thereon by conventional commercial processes. More specifically, the present invention comprehends the subjection of the surface portion to bromine in an environment which effectively controls the action of the bromine, permitting the bromine to be used at a relatively low temperature and at a controlled reaction rate so as to provide the desired activation of the surface portion without undesirable excessive etching or dissolution of the surface portion.

Broadly, the invention comprehends subjecting the surface portion to an activator consisting of bromine in an aqueous solution selected from the group consisting of an aqueous chloride solution and an aqueous bromide solution.

The invention further comprehends the treatment with a saturated or dilute solution of bromine and water, although with such an activator, more careful control of the activating action is required.

Exemplary of the novel substrate preparation process of the present invention, substrates formed of Ryton, Udel and Victrex were subjected to a saturated solution of bromine in 6 N hydrochloric acid at room temperature for periods of one-half hour, one hour, and one and one-half hours. Each of the samples was found to provide suitable adhesion of the subsequent metal plating.

Samples of Ryton R-4 and BR-57 and Victrex 420P and 520P were treated in a 2 M KBr solution in water with 25 g/l of bromine at 50° C. for 30 minutes followed by subjection thereof to a commercial electroless copper plating process with good results.

Samples of Ryton R-4, R-10, and BR-57 and Victrex 420P and 520P were successfully plated by first subjecting the surface thereof to a saturated solution of bromine in water at room temperature for a period of 30 minutes or 1 hour, followed by a commercial electroless copper plating treatment.

Ryton R-4 was satisfactorily plated by subjection thereof to a pre-etch for 30 minutes in bromine water at room temperature, followed by a rinse, followed by an etching in potassium dichromate-sulfuric acid solution for 5 minutes at 60° C., and followed by a rinse prior to the processing thereof through a commercial electroless copper plating line.

Broadly, the Ryton had been found to be satisfactorily activated by subjection thereof to a solution of 1 to 50 grams of $Br_2$ in an aqueous solution that is 1-3 molar with respect to NaCl, KCl, KBr, $CaBr_2$, $CaCl_2$, $ZnBr_2$, $ZnCl_2$, or any soluble Group I, II, or III chloride or bromide salt. Liquid bromine complexes with quaternary ammonium compounds may be used to effect the desired activation with slightly less efficiency, although the necessary bromine concentration therein is substantially higher, such as up to 1000 grams per liter.

In carrying out the process, it is preferable that the substrate bodies are firstly degreased prior to subjection to the bromine activating agent. Further, the samples are rinsed prior to the electroless plating step.

Heretofore, no known etchants were available for Ryton, and as Ryton offers a number of advantages for use as a substrate for printed circuit boards, the novel activation process of the present invention offers a highly desirable improvement in the art. Both the Udel and Victrex substrates required solvent preetching steps which adversely affect the dimensional stability of the substrate. Mechanical abrasion of the substrate surface also has led to similar problems relative to dimensional stability.

Thus, the use of bromine for etching thermoplastics, such as Ryton, Udel and Victrex, provides an unexpected, novel activation of such materials such as for use in accepting an electroless plating of copper or nickel for subsequent deposition of a thicker layer of copper, as in the manufacture of printed circuit boards.

The foregoing disclosure of specific embodiments is illustrative of the broad inventive concepts comprehended by the invention.

I claim:

1. The method of treating the surface of a body formed of polyphenylene sulfide, comprising the step of
   subjecting the surface to a solution of bromine in an aqueous solution selected from the group consisting of an aqueous chloride solution and an aqueous bromide solution.

2. The method of treating the surface of a body formed of polysulfone, comprising the step of
   subjecting the surface to a solution of bromine in an aqueous solution selected from the group consisting of an aqueous chloride solution and an aqueous bromide solution.

3. The method of treating the surface of a substrate board body formed of polyphenylene sulfide, comprising the step of
   subjecting said surface to a solution of bromine in an aqueous solution selected from any one of the group consisting of quaternary ammonium chloride, quaternary ammonium bromide, Group I chloride, Group II chloride, Group III chloride, Group I bromide, Group II bromide, and Group III bromide salt solution to effect a treatment of said surface suitable for said subsequent electroless metal deposition.

4. The method of treating the surface of a polyphenylene sulfide body of claim 1 wherein the bromine is present in the amount of approximately 1-50 grams per liter in a solution which is approximately 1-3 molar with respect to the chloride or bromide salts.

5. The method of treating the surface of a polysulfone body of claim 2 wherein the bromine is present in the amount of approximately 1-50 grams per liter in a solution which is approximately 1-3 molar with respect to the chloride or bromide salts.

6. The method of treating the surface of a polyphenylene sulfide substrate board body of claim 3 wherein the bromine is present in the amount of approximately 1-50 grams per liter in a solution which is approximately 1-3 molar with respect to the chloride or bromide salts.

7. The method of treating the surface of a polyphenylene sulfide substrate board body of claim 3 wherein the bromine is present as a liquid complex in the amount of up to approximately 1000 grams per liter of said liquid complex with the quaternary ammonium salt.

8. The method of treating the surface of a polyphenylene sulfide body of claim 1 wherein the step of subjecting the surface to said solution is carried out at a temperature of less than approximately 200° F.

9. The method of treating the surface of a polysulfone body of claim 2 wherein the step of subjecting the surface to said solution is carried out at a temperature of less than approximately 200° F.

10. The method of treating the surface of a polyphenylene sulfide substrate board body of claim 3 wherein the step of subjecting the surface to said solution is carried out at a temperature of less than approximately 200° F.

11. The method of treating the surface of a polyphenylene sulfide body of claim 1 wherein said treatment of the surface effects an etching thereof.

12. The method of treating the surface of a polysulfone body of claim 2 wherein said treatment of the surface effects an etching thereof.

13. The method of treating the surface of a polyphenylene sulfide substrate board body of claim 3 wherein said treatment of the surface effects an etching thereof.

14. The method of treating the surface of a polyphenylene sulfide body of claim 1 including the further step of degreasing said surface prior to the step of subjecting the surface to the aqueous solution of bromide.

15. The method of treating the surface of a polysulfone body of claim 2 including the further step of degreasing said surface prior to the step of subjecting the surface to the aqueous solution of bromide.

16. The method of treating the surface of a polyphenylene sulfide substrate board body of claim 3 including the further step of degreasing said surface prior to the step of subjecting the surface to the aqueous solution of bromide.

17. The method of treating the surface of a polyphenylene sulfide body of claim 1 including the further step of depositing a thin layer of electroless copper on said surface.

18. The method of treating the surface of a polysulfone body of claim 2 including the further step of depositing a thin layer of electroless copper on said surface.

19. The method of treating the surface of a polyphenylene sulfide substrate board body of claim 3 including the further step of depositing a thin layer of electroless copper on said surface.

* * * * *